United States Patent
Kim et al.

(10) Patent No.: US 7,835,215 B2
(45) Date of Patent: Nov. 16, 2010

(54) SEMICONDUCTOR MEMORY APPARATUS CAPABLE OF REDUCING GROUND NOISE

(75) Inventors: Dong Keum Kim, Gyeonggi-do (KR); Chae Kyu Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 108 days.

(21) Appl. No.: 12/359,623

(22) Filed: Jan. 26, 2009

(65) Prior Publication Data
US 2009/0257302 A1    Oct. 15, 2009

Related U.S. Application Data

(62) Division of application No. 11/637,080, filed on Dec. 12, 2006, now Pat. No. 7,499,363.

(30) Foreign Application Priority Data

Apr. 6, 2006    (KR) .................. 10-2006-0031402

(51) Int. Cl.
*G11C 5/14* (2006.01)
*G11C 5/02* (2006.01)
*G11C 5/06* (2006.01)
*G11C 8/00* (2006.01)

(52) U.S. Cl. .................. 365/226; 365/51; 365/63; 365/230.03

(58) Field of Classification Search ............ 365/51, 365/63, 226, 227, 228, 229, 230.03
See application file for complete search history.

(56) References Cited

U.S. PATENT DOCUMENTS

| 5,699,289 | A   | 12/1997 | Takenaka |
| 6,313,695 | B1  | 11/2001 | Ooishi et al. |
| 6,384,674 | B2  | 5/2002  | Tanizaki et al. |
| 6,731,527 | B2* | 5/2004  | Brown .................. 365/63 |
| 6,781,869 | B2* | 8/2004  | Ohbayashi et al. ......... 365/154 |
| 6,894,943 | B2  | 5/2005  | Suzuki et al. |
| 2002/0084835 | A1 | 7/2002 | Takahashi |

(Continued)

FOREIGN PATENT DOCUMENTS

JP    2001216780    8/2001

(Continued)

*Primary Examiner*—Ly D Pham
(74) *Attorney, Agent, or Firm*—Venable LLP; Jeffri A. Kaminski

(57) ABSTRACT

An apparatus includes a plurality of first driving signal driving units, and generates a first driving signal by driving an input signal, a plurality of second driving signal driving units, each of which drives an input signal and generates a second driving signal, a timing control unit that controls each of the first driving signal driving units such that a predetermined time difference is generated between an enable timing of the first driving signal and an enable timing of the second driving signal, a plurality of sense amplifier driving units, each of which generates a first driving level and a second driving level according to the first driving signal and the second driving signal, and a plurality of sense amplifiers that are provided for respective bit line pairs, and each include first type switching elements operating according to the first driving level and second type switching elements operating according to the second driving level.

10 Claims, 12 Drawing Sheets

U.S. PATENT DOCUMENTS

| | | |
|---|---|---|
| 2002/0131221 A1 | 9/2002 | Lien et al. |
| 2002/0171461 A1 | 11/2002 | Yamazaki et al. |
| 2004/0085846 A1 | 5/2004 | Yokozeki et al. |
| 2004/0125681 A1 | 7/2004 | Yamaoka et al. |
| 2006/0250848 A1 | 11/2006 | Maejima |
| 2007/0201295 A1 | 8/2007 | Lines |
| 2007/0205801 A1 * | 9/2007 | Perisetty .................. 326/26 |
| 2008/0055967 A1 | 3/2008 | Houston et al. |

FOREIGN PATENT DOCUMENTS

| | | |
|---|---|---|
| KR | 1019980011444 | 4/1998 |

* cited by examiner

SEMICONDUCTOR MEMORY APPARATUS CAPABLE OF REDUCING GROUND NOISE

This application is a divisional of U.S. patent application Ser. No. 11/637,080, filed Dec. 12, 2006, now U.S. Pat. No. 7,499,363 the subject matter of which application is incorporated herein by reference in its entirety.

This application claims the benefit of Korean Patent Application No. 10-2006-0031402, filed on Apr. 6, 2007, in the Korean Intellectual Property Office, the disclosure of which is incorporated herein in its entirety by reference.

TECHNICAL FIELD

The present invention relates to a semiconductor memory apparatus, and more particularly, to a semiconductor memory apparatus that is capable of reducing ground noise and reducing power consumption.

RELATED ART

As design technology and process technology of semiconductor memory apparatuses have been developed, a degree of integration thereof has been increased. As a result, semiconductor memory apparatuses that can operate with a low operation voltage have been developed. As such, with an increase in an integration density of the semiconductor memory apparatuses, a design rule of a unit cell that is smaller than a submicron unit is used in designing memory apparatuses. As a result, various elements that form the memory circuits have been reduced in size. Meanwhile, a system adapted for the semiconductor memory apparatuses is designed such that as a frequency of a central processing unit (CPU) increases, the semiconductor memory apparatuses can also operate with a high frequency. As a result, while the various elements have been reduced in size, in order to design memory circuits in which a high frequency operation can be performed, a decrease in a power supply voltage VDD is inevitable. For example, in a semiconductor memory apparatus, such as a synchronous DRAM having a level higher than a DDR3, which has attracted attention as the next generation of memory, a power supply voltage of 1.5 V or less is required. In particular, for example as for a DRAM that is mounted on a portable electronic devices and/or communication apparatus, recent research has progressed where an operation voltage is in a range of 1.0 V or less.

Even though the semiconductor memory apparatus strives to achieve a high frequency operation, a high integration degree and low power consumption, it is important to efficiently resolve problems, such as current consumption and noise inside a chip. In particular, it is important to reduce a ground bouncing noise occurring among banks, and an operation current and a leak current of the banks, because these are associated with operational stability of the semiconductor memory apparatus.

FIG. 1 is a simplified block diagram illustrating a ground power supply connection structure of a general bank. In general, the semiconductor memory apparatus includes a plurality of banks, each of which has the same structure as that shown in FIG. 1. According to an inner structure of the bank, the bank includes a core block 100 that has a memory cell array and a bit line sense amplifier array, a row control block 200 (X control block) that drives a row address signal of the core block 100, a column control block 300 (Y control block) that drives a column address signal of the core block 100, and a bank internal control block 400 (XY control block) that controls the row control block 200 and the column control block 300 according to a bank selection command.

In particular, in a connection structure shown in FIG. 1, a ground power supply pad 10 (VSS PAD) is disposed outside the bank, and the row control block 200, the column control block 300, and the bank internal control block 400 are connected in common to the ground power supply pad 10. In addition, the core block 100 is directly connected to a node "A" so as to protect regions of memory cells (not shown) from noise of the other blocks.

FIG. 2 is a block diagram specifically illustrating a ground power supply connection structure inside the core block 100 of FIG. 1. The core block 100 includes a cell array 110 where a plurality of memory cells are disposed, a bit line sense amplifier array 120 (BLSA array) where a plurality of sense amplifiers, each sensing data of each of the memory cells, are disposed, a sub word line driver array 130 (SWL driver array) that drives word lines of the memory cells, and a sub hole 140 where a relay is disposed to relay a bit line dividing signal and a bit line equalizing signal. FIG. 2 shows a case in which a semiconductor memory apparatus uses a sub word line scheme.

In the structure of FIG. 2, the bit line sense amplifier array 120, the sub word line driver array 130, and the sub hole 140 are connected in common to one ground line VSS.

Meanwhile, as a capacitance of a semiconductor memory apparatus is increased, the number of memory cells in the core block 100 is increased. Thus the number of each of the bit line sense amplifiers and the sub word line drivers is increased. In addition, sizes of the row control block 200 and the column control block 300 that control the core block 100, and a size of the bank internal control block 400 are also increased. If the bank 100 performs an activation operation, a large number of transistors in the core block 100 are driven, which causes ground noise. Therefore, in order to minimize an influence on the other blocks in the same bank, that is, the row control block 200, the column control block 300, and the bank internal control block 400 due to the ground noise, a ground source is connected to the node A, as shown in FIG. 1. However, as the capacitance of the semiconductor memory apparatus is increased, a ground noise due to an activation operation of the selected bank is gradually increased. Also, even when the bank is not selected, an amount of leak current of the respective control blocks in the bank is also increased. The leak current is increased when the capacitance of the semiconductor memory apparatus is increased.

SUMMARY OF THE INVENTION

An embodiment of the present invention provides a semiconductor memory apparatus that is capable of reducing an influence due to ground noise and ensuring a stable operation.

Another embodiment of the present invention provides a semiconductor memory apparatus that is capable of causing the ground source connection of a bank to be controlled.

Still another embodiment of the present invention provides a semiconductor memory apparatus that is capable of causing a ground noise outside a bank to be blocked.

A further embodiment of the present invention provides a semiconductor memory apparatus that is capable of minimizing an influence due to a leak current and reducing an amount of current consumed.

A first embodiment of the present invention provides a semiconductor memory apparatus, which includes a bank that includes a core block where a memory cell array is disposed and a control block to drive the memory cell array; a ground power supply pad that is supplied with a ground power through a ground line; a switch that connects the ground line and the core block; and a block control unit that controls an on/off operation of the switch.

Preferably, the bank includes a core block that has the memory cell array and a bit line sense amplifier array, a row control block that drives a row address path of the core block, a column control block that drives a column address path of the core block, and a bank internal control block that controls the row control block and the column control block according to a bank selection command.

Preferably, the row control block, the column control block, and the bank internal control block are connected in common to the ground power supply pad.

Preferably, the block control unit includes an input unit that receives a clock enable signal and a self refresh signal, and a driver that outputs a block control signal controlling the switch in response to an output signal of the input unit. Preferably, the input unit is composed of a NOR gate that receives the clock enable signal and the self refresh signal. Preferably, the driver is composed of an inverter that receives the output signal of the input unit. Preferably, the driver is composed of a level shifter that receives the output signal of the input unit and converts a level of the output signal of the input unit.

Preferably, the switch is composed of a NMOS transistor. Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal.

Preferably, the core block further includes a first core ground line that supplies a ground power to the bit line sense amplifier array and the sub hole, and a second core ground line that supplies the ground power to the sub word line driver array.

Preferably, the first ground line and the second ground line are branched from the switch to be thus disposed. Preferably, the ground power supply pad is disposed outside the bank. Preferably, the block control unit is disposed outside the bank.

A second embodiment of the present invention provides a semiconductor memory apparatus which includes a bank that includes a core block where a memory cell array is disposed and a control block to drive the memory cell array; a ground power supply pad that is supplied with a ground power through a ground line; a first core ground line that connects the ground line and the core block; a second core ground line that connects the ground line and the core block; a switch that is formed on the first core ground line; and a block control unit that controls an on/off operation of the switch.

Preferably, the bank includes a core block that includes the memory cell array and a bit line sense amplifier array, a row control block that drives a row address path of the core block, a column control block that drives a column address path of the core block, and a bank internal control block that controls the row control block and the column control block according to a bank selection command.

Preferably, the row control block, the column control block, and the bank internal control block are connected in common to the ground power supply pad. Preferably, the switch is composed of a NMOS transistor.

Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal.

Preferably, in the core block, the bit line sense amplifier array and the sub hole are connected to the first core ground line, and the sub word line driver array is connected to the second core ground line. Preferably, the ground power supply pad is disposed outside the bank.

Preferably, the block control unit is disposed outside the bank.

A third embodiment of the present invention provides a semiconductor memory apparatus, which includes a bank that includes a core block where a memory cell array is disposed and a control block to drive the memory cell array, a ground power supply pad that is supplied with a ground power supply through a ground line, a switch that connects the ground power supply pad and the control block, and a block control unit that controls an on/off operation of the switch.

Preferably, the control block includes a row control block that controls a row address path of the core block, a column control block that controls a column address path of the core block, and a bank internal control block that controls the row control block and the column control block according to a bank selection command.

Preferably, the row control block, the column control block, and the bank internal control block are connected in common to the ground power supply pad through the switch. Preferably, the block control unit includes an input unit that receives a clock enable signal and a self refresh signal, and a driver that outputs a block control signal controlling the switch in response to an output signal of the input unit. Preferably, the switch is composed of an NMOS transistor.

Preferably, the semiconductor memory apparatus according to the third embodiment of the present invention further includes a first core ground line that connects the ground line and the core block, and a second core ground line that connects the ground line and the core block. Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal. Preferably, in the core block, the bit line sense amplifier array and the sub hole are connected to the first core ground line, and the sub word line driver is connected to the second core ground line. Preferably, the ground power supply pad is disposed outside the bank. Preferably, the block control unit is disposed outside the bank.

A fourth embodiment of the present invention provides a semiconductor memory apparatus, which includes a bank that includes a core block where a memory cell array is disposed and a control block to drive the memory cell array; a ground power supply pad that is supplied with a ground power supply through a ground line; a switch that connects the ground power supply pad and the bank; and a block control unit that controls an on/off operation of the switch. Preferably, the bank includes the core block that has the memory cell array and a bit line sense amplifier array, a row control block that drives a row address path of the core block; a column control block that drives a column address path of the core block; and a bank control unit that controls the row control block and the column control block according to a bank selection command.

Preferably, the row control block, the column control block, and the bank internal control block are connected in common to the switch. Preferably, the bank control unit includes a delay that delays a row active signal, an input unit that receives the row active signal and an output signal of the delay, and a driver that outputs a bank control signal controlling the switch in response to an output signal of the input unit. Preferably, the delay is composed of an inverter chain. Preferably, the input unit is composed of a NOR gate that receives the row active signal and the output signal of the delay. Preferably, the driver is composed of an inverter that receives an output signal of the input unit. Preferably, the switch is composed of an NMOS transistor.

Preferably, the semiconductor memory apparatus according to the fourth embodiment of the present invention further includes a first core ground line that connects the switch and the core block, and a second core ground line that connects the switch and the core block. Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal. Preferably, in the core block, the bit line sense amplifier array and the sub hole are connected to the first core ground line, and the sub word line driver array is connected to the second core ground line. Preferably, the ground power supply pad is disposed outside the bank. Preferably, the bank control unit is disposed outside the bank.

A fifth embodiment of the present invention provides a semiconductor memory apparatus, which includes a bank that includes a core block where a memory cell array is disposed and a control block to drive the memory cell array, a ground power supply pad that is supplied with a ground power supply through a ground line, a switch that connects the ground power supply pad and the bank, a bank control unit that controls an on/off operation of the switch, a first core ground line that connects the switch and the core block, and a second core ground line that connects the ground line and the core block.

Preferably, the bank includes the core block that has the memory cell array and a bit line sense amplifier array, a row control block that drives a row address path of the core block, a column control block that drives a column address path of the core block, and a bank internal control block that controls the row control block and the column control block according to a bank selection command.

Preferably, the row control block, the column control block, and the bank internal control block are connected in common to the switch. Preferably, the switch is composed of a NMOS transistor. Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal.

Preferably, in the core block, the bit line sense amplifier array and the sub hole are connected to the first core ground line, and the sub word line driver array is connected to the second core ground line. Preferably, the ground power supply pad is disposed outside the bank. Preferably, the bank control unit is disposed outside the bank.

A sixth embodiment of the present invention provides a semiconductor memory apparatus, which includes a first bank group where a plurality of banks are disposed in an upper column; a second bank group where a plurality of banks are disposed in a lower column; a first ground line for the first bank group; a second ground line for the second bank group; a first switch group including a plurality of switches that connect respective banks of the first bank group to the first ground line; a second switch group including a plurality of switches that connect respective banks of the second bank group to the second ground line; a bank control unit that is disposed between the first bank group and the second bank group and controls an on/off operation of each of the first switch group and the second switch group; and a ground power supply pad that is connected to the first ground line and the second ground line.

Preferably, the bank includes a core block that has the memory cell array and a bit line sense amplifier array, a row control block that drives a row address path of the core block, a column control block that drives a column address path of the core block, and a bank internal control block that controls the row control block and the column control block according to a bank selection command.

Preferably, each switch of the first switch group and the second switch group is composed of an NMOS transistor. Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal.

A seventh embodiment of the present invention provides a semiconductor memory apparatus, which includes a first bank group where a plurality of banks are disposed in an upper column, a second bank group where a plurality of banks are disposed in a lower column, a first ground line for the first bank group, a second ground line for the second bank group, a first switch group including a plurality of switches that connect the respective banks of the first bank group to the first ground line, a second switch group including a plurality of switches that connect the respective banks of the second bank group to the second ground line, a bank control unit that is disposed between the first bank group and the second bank group and controls an on/off operation of each of the first switch group and the second switch group, a ground power supply pad that is connected to the first ground line and the second ground line, and a plurality of core ground lines that directly connect the respective banks of the first bank group or the respective banks of the second bank group and the first ground line or the second ground line.

Preferably, the bank includes a core block that includes the memory cell array and a bit line sense amplifier array, a row control block that drives a row address path of the core block, a column control block that drives a column address path of the core block, and a bank internal control block that controls the row control block and the column control block according to a bank selection command.

Preferably, each switch of the first switch group and the second switch group is composed of an NMOS transistor. Preferably, the core block includes a cell array where a plurality of memory cells are disposed, a bit line sense amplifier array where a plurality of sense amplifiers, each sensing data of each of the memory cells, are disposed, a sub word line driver array that drives word lines of the memory cells, and a sub hole where a relay is disposed to relay a bit line dividing signal and a bit line equalizing signal. Preferably, each of the plurality of core ground lines is directly connected to the core block in the bank.

DESCRIPTION OF EXEMPLARY EMBODIMENTS

Embodiments of the invention will now be described in detail with reference to the accompanying drawings.

Figure 3:
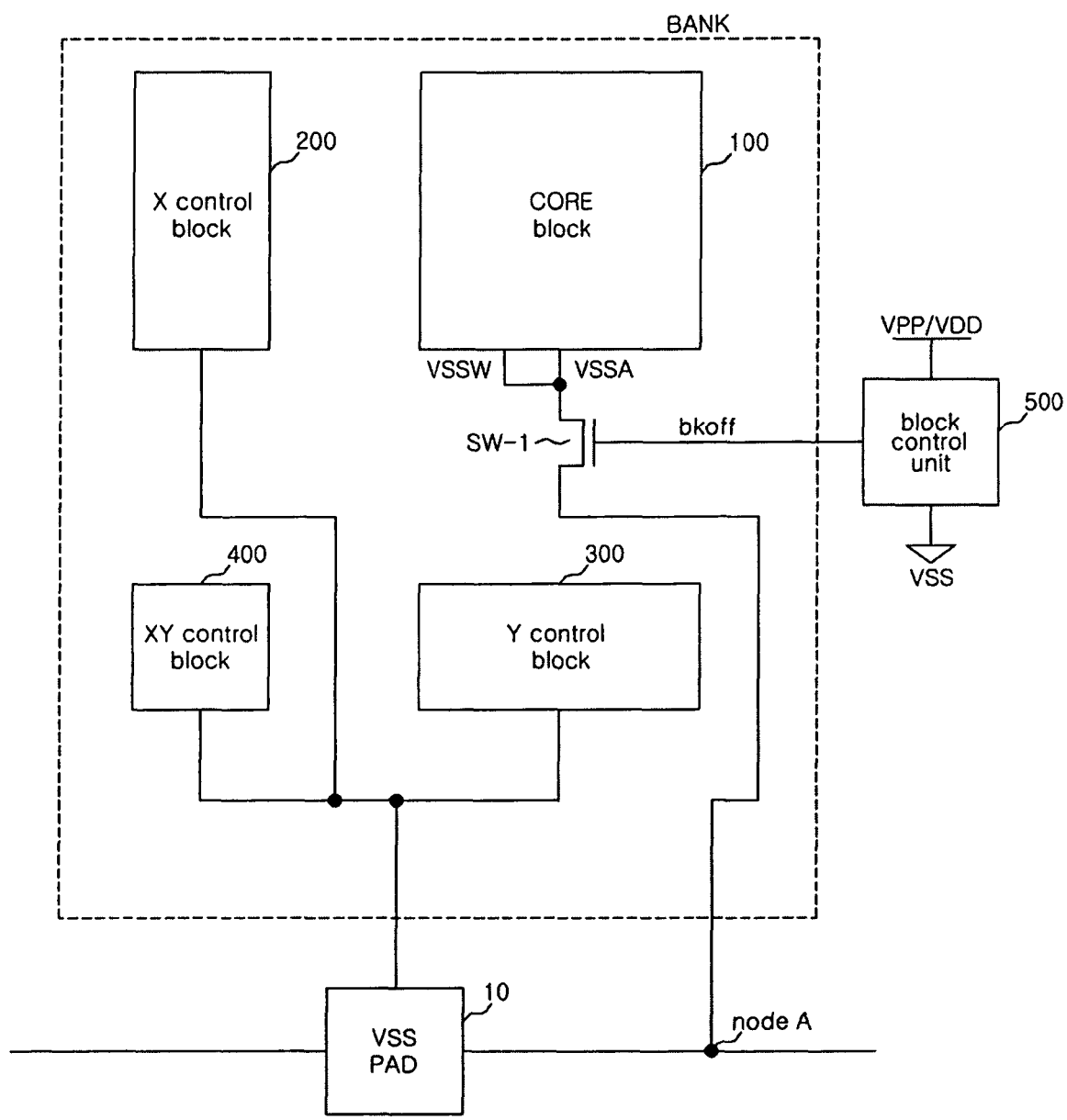
FIG. 3 is a block diagram illustrating a ground power supply connection structure in a bank according to an embodiment of the invention.

Referring to FIG. 3, a semiconductor memory apparatus according to an embodiment of the present invention includes a bank BANK that has a core block 100 where a memory cell array is disposed and a control block to drive the memory cell array; a ground power supply pad 10 that is supplied with a ground power supply VSS through a ground line; a switch SW-1 that connects the ground line and the core block 100; and a block control unit 500 that controls an on/off operation of the switch.

The bank BANK includes the core block 100 that has the memory cell array and a bit line sense amplifier array; a row control block 200 (X control block) that drives a row address path of the core block 100; a column control block 300 (Y control block) that drives a column address path of the core block 100; and a bank internal control block 400 (XY control block) that controls the row control block 200 and the column control block 300 according to a bank selection command. The row control block 200, the column control block 300, and the bank internal control block 400 are connected in common to the ground power supply pad 10 (VSS PAD). It is preferable that the switch SW-1 be composed of an NMOS transistor that receives a block control signal bkoff through its gate. However, the switch SW-1 may be composed of a transistor having a different switching characteristic, in addition to the NMOS transistor. Meanwhile, it is preferable that the ground power supply pad 10 be disposed outside the bank BANK. Further, it is preferable that the block control unit 500 also be disposed outside the bank BANK.

Referring to FIG. 3, according to the ground line structure of an embodiment of the present invention, the direct transmission of ground noise occurring in the core block 100 at the time of an active operation to other blocks in the bank BANK may be minimized. Also, referring to the core block 100 in a structure shown in FIG. 3, a ground line is branched into two core ground lines VSSA and VSSW through the switch SW-1, and are then connected to the core block 100, such that various circuits forming an inner part of the core block 100 are minimally affected by noise on the ground line, which will be described in detail below.

Figure 4:
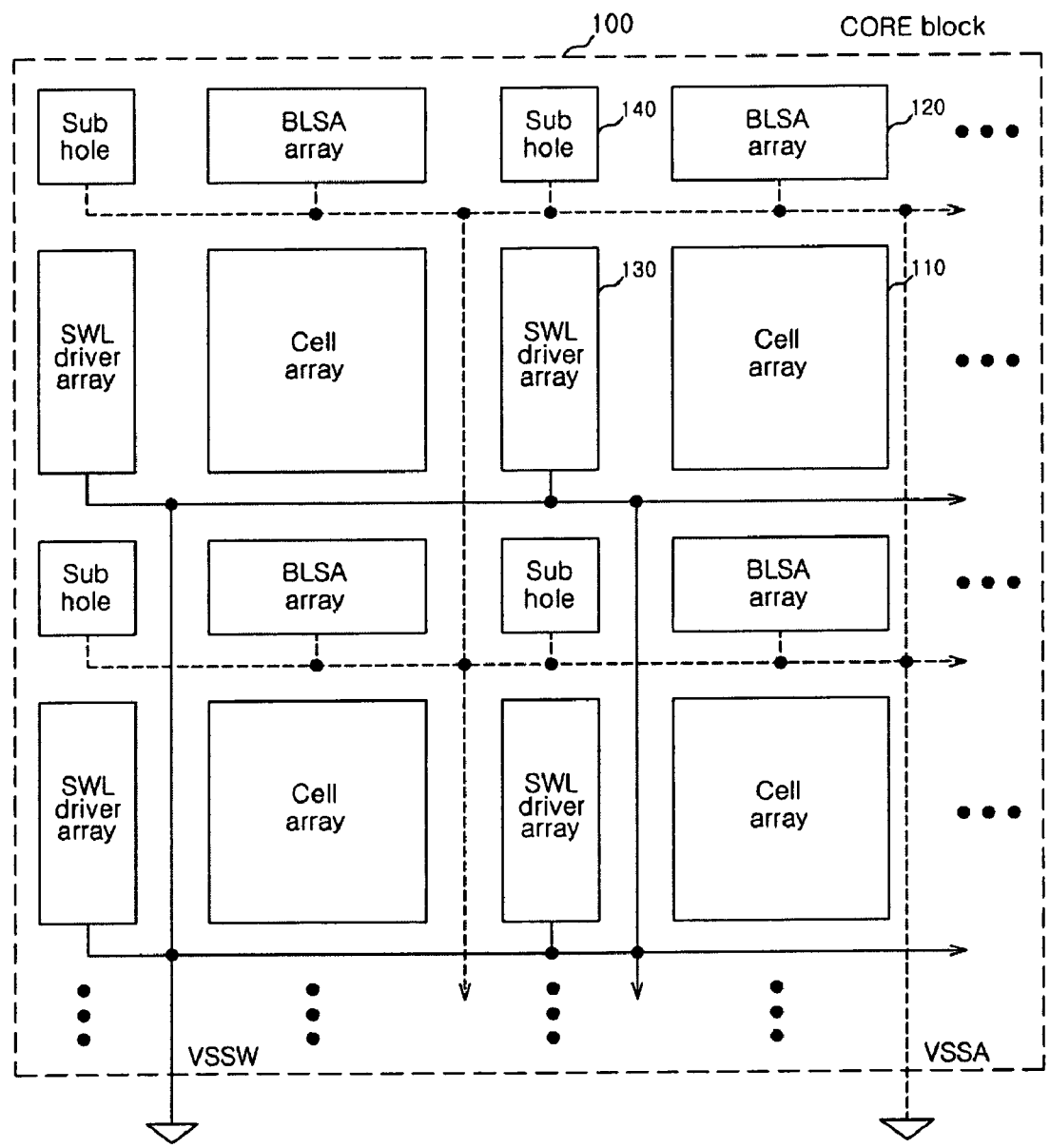
FIG. 4 is a block diagram illustrating details of a ground power supply connection structure in a core block of FIG. 3.

Referring to FIG. 4, the core block 100 includes a cell array 110 where a plurality of memory cells are disposed; a bit line sense amplifier array 120 (BLSA array) where a plurality of sense amplifiers, each of which senses data of a memory cell, are disposed; a sub word line driver array 130 (SWL driver array) that drives word lines of the memory cells; and a sub hole 140 where a delayer, which delays a bit line separating signal and a bit line equalizing signal, is disposed. According to an embodiment of present the invention, the semiconductor memory apparatus includes the first core ground line VSSA that supplies a ground power supply to the bit line sense amplifier array 120 and the sub hole 140, and the second core ground line VSSW that supplies a ground power supply to the sub word line driver array 130. The first ground line VSSA and the second ground line VSSW are branched from the switch SW-1 of FIG. 3.

As such, the ground line used in the core block 100 is branched into the first ground line VSSA and the second ground line VSSW. According to the two ground line, the inner part of the core block 100 can be minimally affected by noise.

Figure 1:
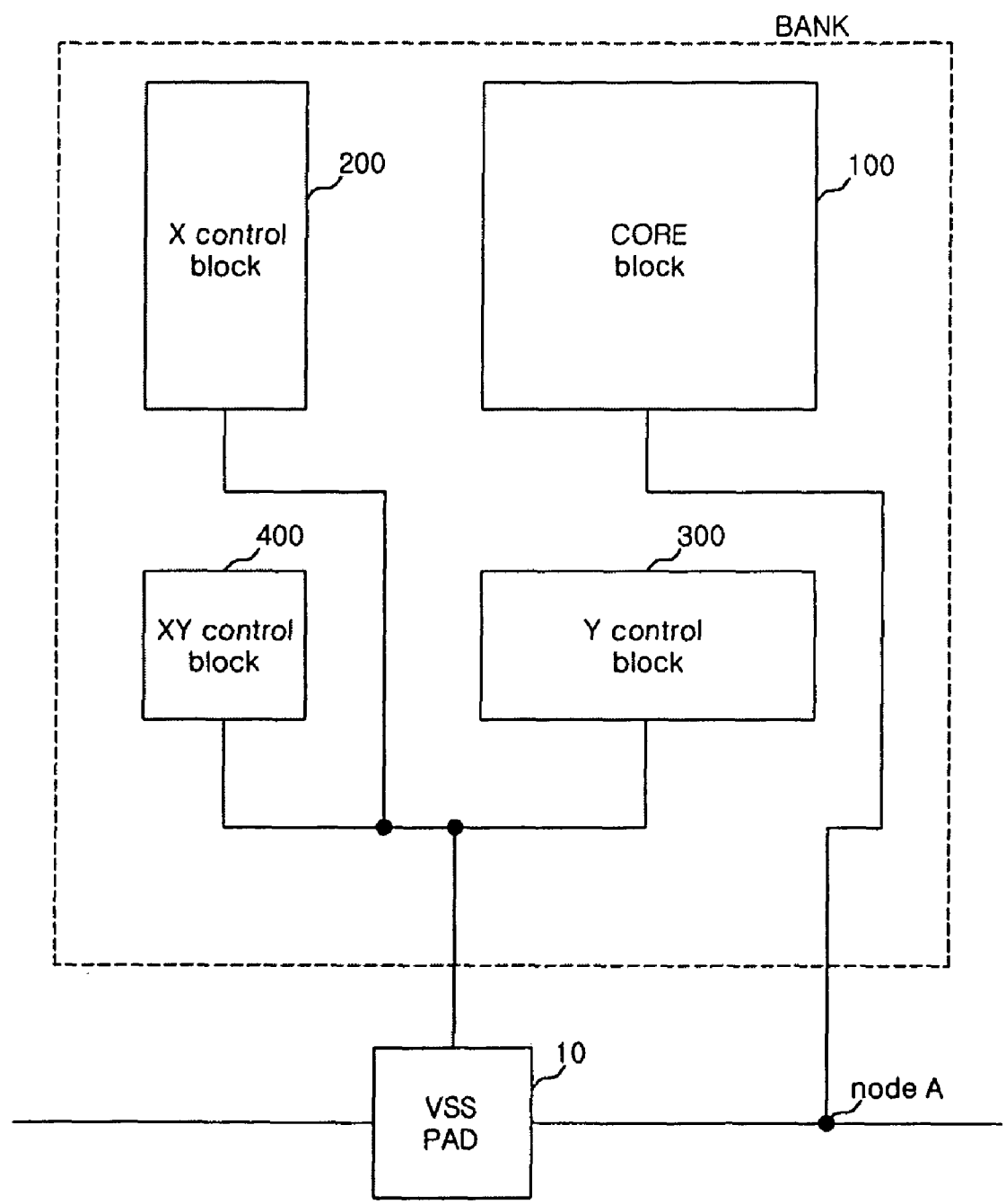
FIG. 1 is a block diagram illustrating a ground power supply connection structure of a conventional bank.
Figure 2:
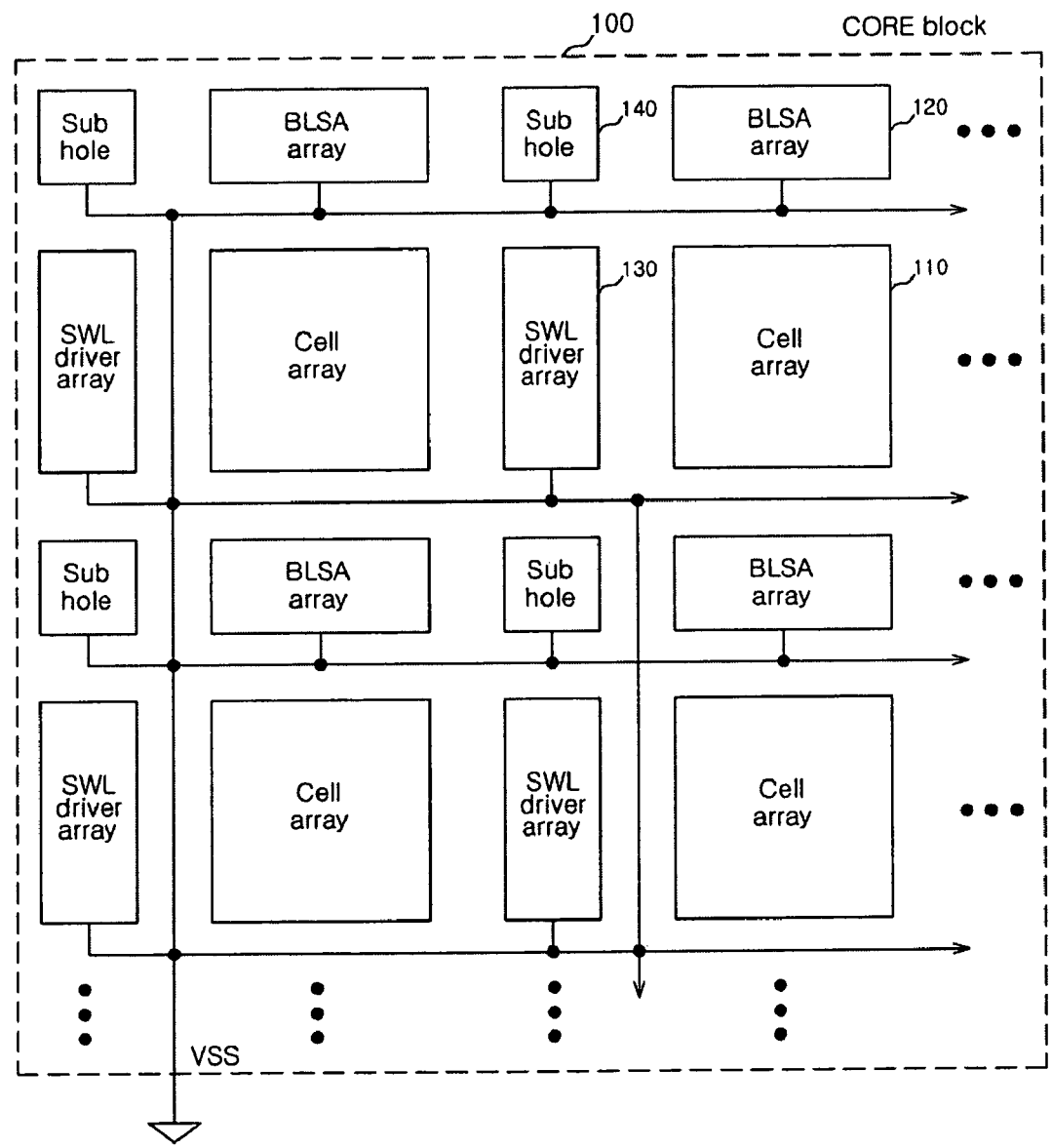
FIG. 2 is a block diagram specifically illustrating a ground power supply connection structure in a core block of FIG. 1.

Meanwhile, the bit line sense amplifier 120, the sub word line driver array 130 and the sub hole 140 may be connected by the single ground line, as shown the FIG. 1. Using the single ground line, a noise effect is reduced by a structure of the switch SW-1 controlled by the block control unit 500 of FIG. 3.

Figure 5A:
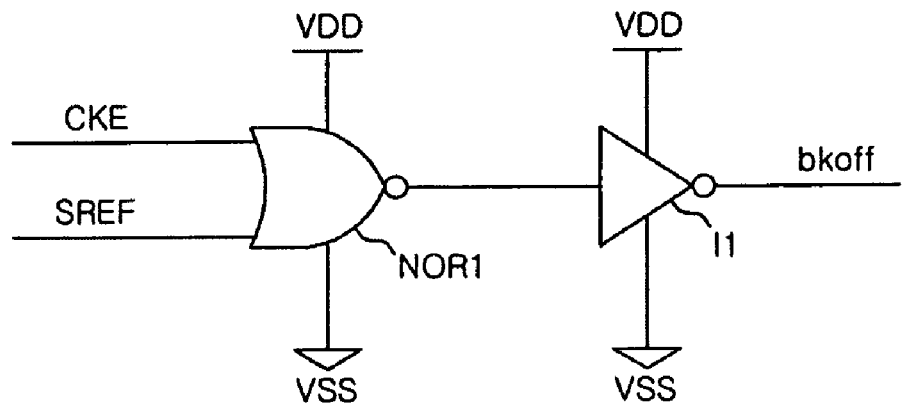
FIGS. 5A and 5B are circuit diagrams illustrating a preferred embodiment of a block control unit of FIG. 3.

Referring to FIG. 5A, the block control unit 500 includes an input unit NOR1 that receives a clock enable signal CKE and a self refresh signal SREF, and a driver I1 that outputs a block control signal bkoff controlling the switch SW-1 in response to an output signal of the input unit NOR1. It is preferable that the input unit NOR1 be composed of a NOR gate that receives the clock enable signal CKE and the self refresh signal SREF. Further, it is preferable that the driver I1 be composed of an inverter that receives the output signal of the input unit NOR1.

In FIG. 5A, the clock enable signal CKE is a signal that is inputted from the outside of the semiconductor memory apparatus and is maintained at a low level in a power down mode or a self refresh mode. The self refresh signal SREF is a signal that is maintained at a high level only at the time of a self refresh operation. Therefore, when operated in a precharge power down mode, both the clock enable signal CKE and the self refresh signal SREF become a low level, and thus the block control signal bkoff becomes a low level so as to turn off the switch SW-1 of FIG. 3. Meanwhile, when the self refresh operation is performed, the clock enable signal CKE maintains a low level. However, since the self refresh signal SREF becomes enabled at a high level, the block control signal bkoff is driven at a high level so as to turn on the switch SW-1. Accordingly, when the bank does not operate by an external command as in the precharge power down mode, it is possible to interrupt a leak current existing in the bit line sense amplifier array 120 and the sub hole 140 of the core block 100, which results in reducing current consumption.

Figure 5B:
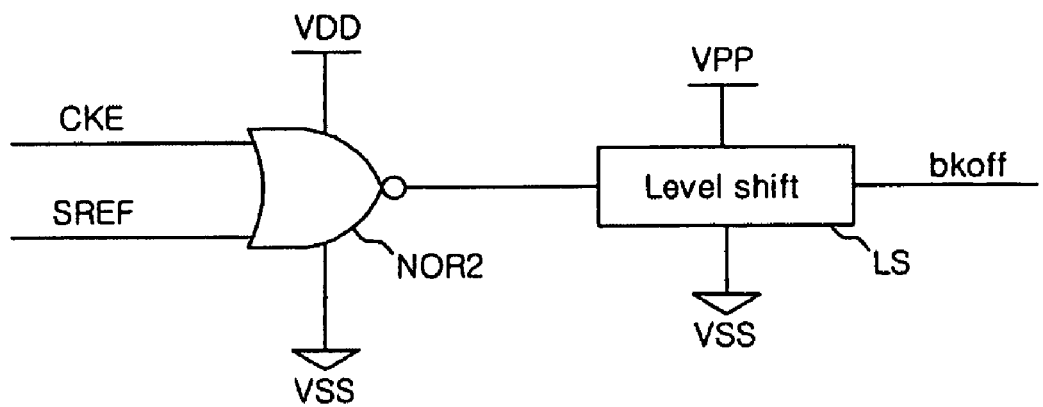

Referring to FIG. 5B, the driver I1 may formed by a level shifter LS. An output signal of an input unit NOR2 is input to the level shifter LS such that a level of the output signal of the input unit NOR2 is converted. According to this structure, an on/off operation of the switch SW-1 is controlled by using an elevated voltage VPP whose potential is larger than that of a power supply voltage VDD supplied from the outside.

As such, the ground power supply connection of the bank or the core block may be controlled by the block control unit 500 and the switch SW-1. Thus an influence due to the ground noise can be minimized and a stable operation can be ensured. Further, since the ground noise outside the bank can be interrupted, an influence due to a leak current can be minimized, and an amount of current consumed can be reduced.

Figure 6:
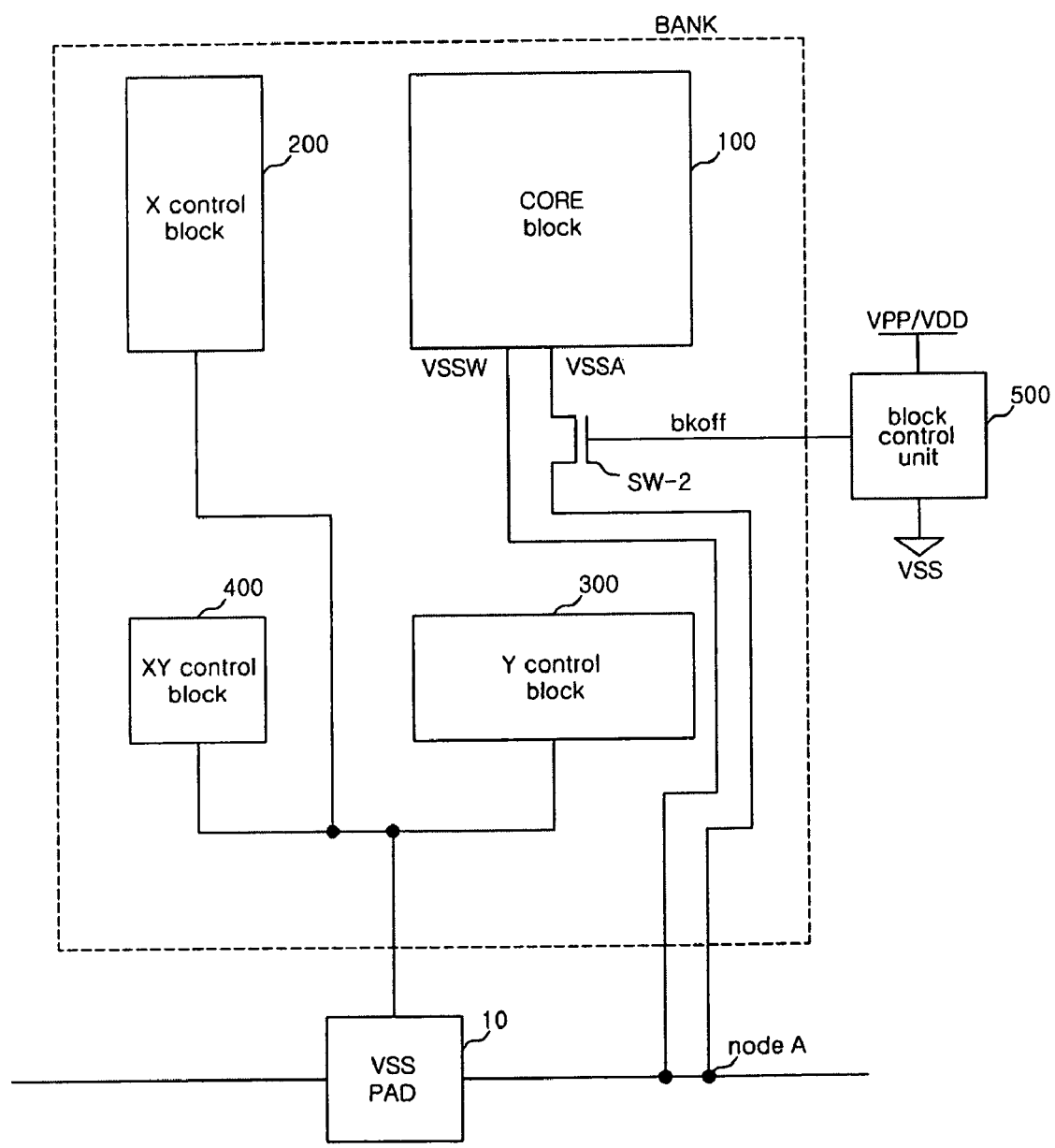
FIG. 6 is a block diagram illustrating a second embodiment of the invention.

FIG. 6 is a block diagram illustrating a second embodiment of the invention. Referring to FIG. 6, a semiconductor memory apparatus according to the second embodiment of the present invention shown in FIG. 6 includes a bank BANK that has a core block where a memory cell array is disposed and a control block to drive the memory cell array, and a ground power supply pad 10 that is supplied with a ground power supply VSS through a ground line. The semiconductor memory apparatus further includes a first core ground line VSSA that connects the ground line and the core block, and a second core ground line VSSW that connects the ground line and the core block. Further, the semiconductor memory apparatus further includes a switch SW-2 that is positioned on the first core ground line VSSA and a block control unit 500 that controls an on/off operation of the switch SW-2.

The bank BANK includes the core block 100 that has the memory cell array and a bit line sense amplifier array, a row control block 200 that drives a row address path of the core block 100, a column control block 300 that drives a column address path of the core block 100, and a bank internal control block 400 that controls the row control block 200 and the column control block according to a bank selection command. The row control block 200, the column control block 300, and the bank internal control block 400 are connected in common to the ground power supply pad 10. It is preferable that the switch SW-2 be composed of an NMOS transistor. The block control unit 500 has the same structure as those of FIGS. 5A and 5B. The core block 100 has the same internal structure as that of FIG. 4. In the internal structure of the core block 100, the bit line sense amplifier array and the sub hole may be connected to the first core ground line VSSA, and the sub word line driver array may be connected to the second core ground line VSSW. The ground power supply pad 10 and/or the block control unit may be disposed outside the bank BANK.

According to the structure of the second embodiment shown in FIG. 6, the ground line VSSW connected to the sub word line driver array in the core block 100 is directly connected to the ground line VSS (that is, node A) at the outside of the bank BANK, and the ground line VSSA is controlled through the switch SW-2. The reason why the ground line VSSW is not controlled by the block control unit 500 is because the sub word line SWL maintains a level of a ground power supply when it is not activated, and thus data of a cell can be easily maintained.

Figure 7:
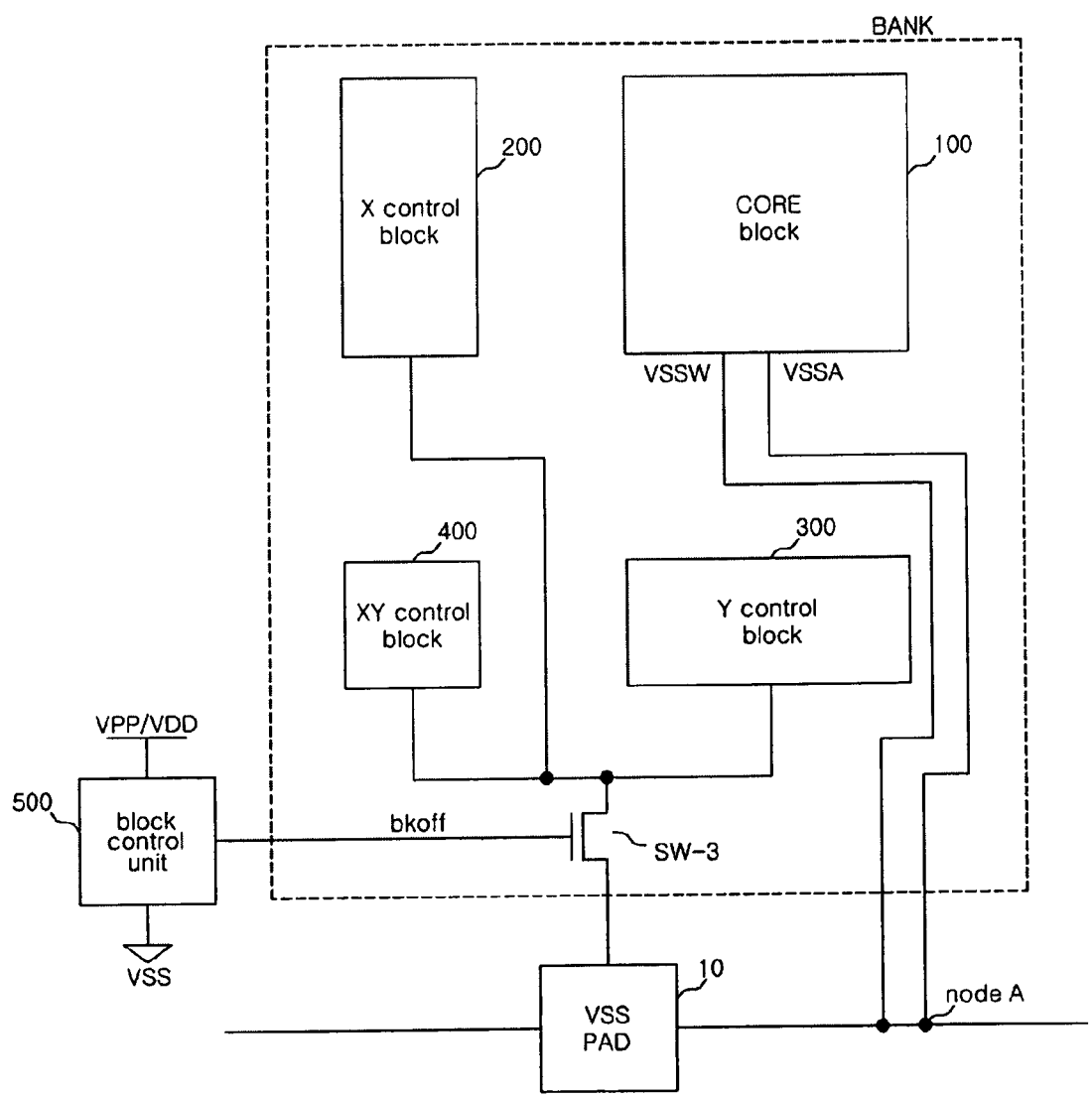
FIG. 7 is a block diagram illustrating a third embodiment of the invention.

FIG. 7 is a block diagram illustrating a third embodiment of the invention. A semiconductor memory apparatus according to the third embodiment of the invention shown in FIG. 7 includes a bank BANK that has a core block where a memory cell array is disposed and a control block to drive the memory cell array; a ground power supply pad 10 that is supplied with a ground power supply VSS through a ground line; a switch SW-3 that connects between the ground power supply pad 10 and the control block; and a block control unit 500 that controls an on/off operation of the switch SW-3.

The control block includes a row control block 200 that drives a row address path of the core block 100, a column control block 300 that drives a column address path of the core block 100, and a bank internal control block 400 that controls the row control block 200 and the column control block 300 according to a bank selection command. The row control block 200, the column control block 300, and the bank internal control block 400 are connected in common to the ground power supply pad through the switch SW-3. The block control unit may have the same structure as those of FIGS. 5A and 5B. Further the switch SW-3 may be composed of an NMOS transistor. As shown in FIG. 7, a first core ground line VSSA that connects between the ground line (that is, node A) and the core block 100, and a second core ground line VSSW that connects the ground line and the core block 100 directly connect the core block 100 and the ground line (that is, node A).

The core block has the same structure as FIG. 4. Further, in the core block 100, the bit line sense amplifier array and the sub hole may be connected to the first core ground line VSSA, and the sub word line driver array may be connected to the second core ground line VSSW. The ground power supply pad 10 may be disposed outside the bank BANK. The block control unit 500 may also be disposed outside the bank BANK.

According to the structure of the third embodiment of the present invention shown in FIG. 7, the switch SW-3 that is controlled by an output signal bkoff of the block control unit 500 is provided between the ground power supply pad 10 and the control block (that is, between the row control block 200, and the column control block 300 and the bank internal control block 400), such that an amount of leak current consumed by each of the row control block 200, the column control block 300, and the bank internal control block 400 is reduced, and the row control block 200, the column control block 300, and the bank internal control block 400 are not affected by ground noise transmitted from the outside of the bank BANK. The structure according to the third embodiment of the invention shown in FIG. 7 is particularly effective when the control blocks (that is, the row control block 200, the column control block 300, and the bank internal control block 400) are vulnerable to ground noise.

Figure 8:
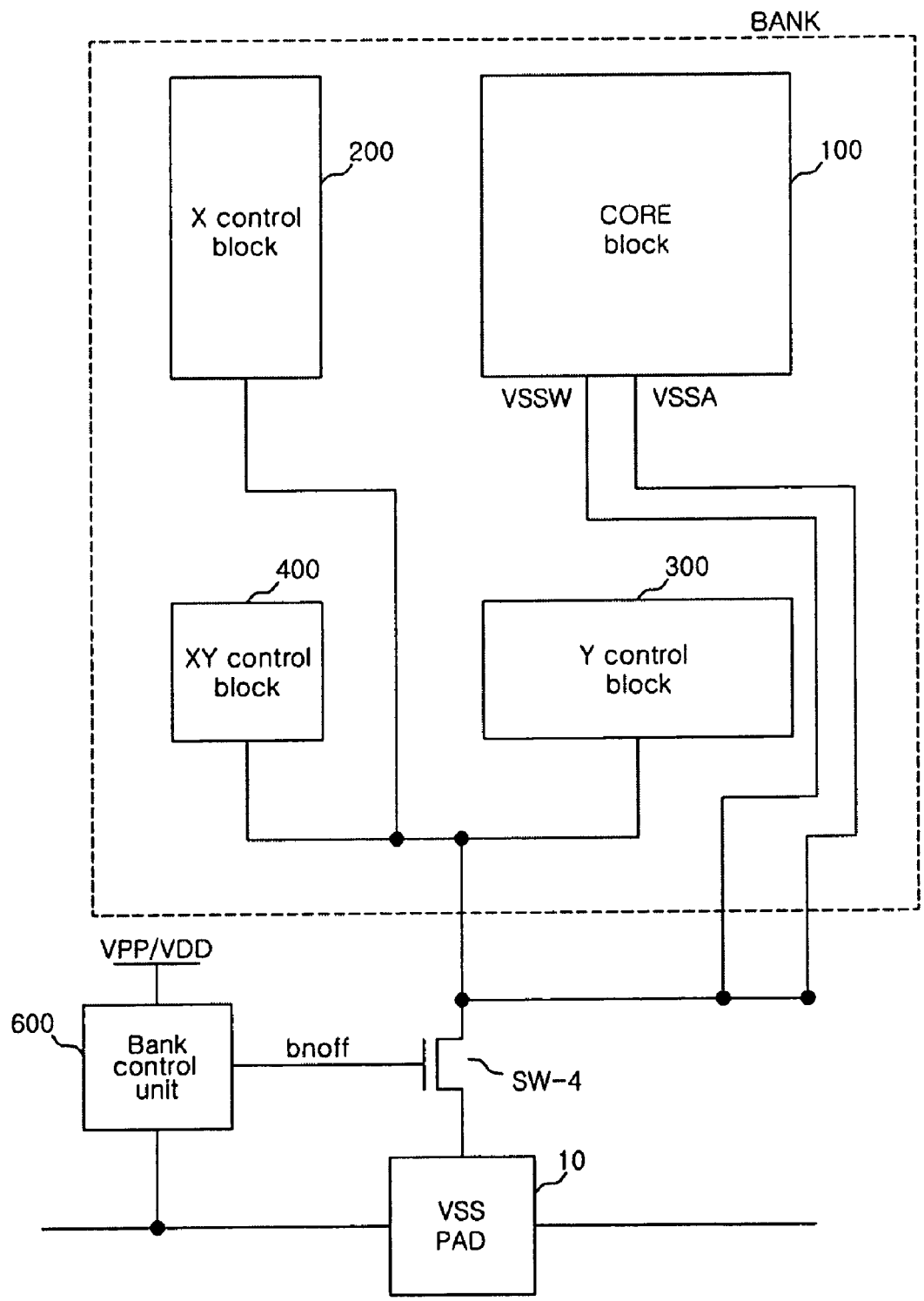
FIG. 8 is a block diagram illustrating a fourth embodiment of the invention.

FIG. 8 is a block diagram illustrating a fourth embodiment of the present invention. A semiconductor memory apparatus according to the fourth embodiment of the invention shown in FIG. 8 includes a bank BANK that has a core block where a memory cell array is disposed and a control block to drive the memory cell array; a ground power supply pad 10 that is supplied with a ground power supply VSS through a ground line; a switch SW-4 that connects the ground power supply pad and the bank BANK; and a bank control unit 600 that controls an on/off operation of the switch SW-4.

The bank includes the core block 100 that has the memory cell array and a bit line sense amplifier array, a row control block 200 that drives a row address path of the core block 100, a column control block 300 that drives a column address path of the core block 100, and a bank internal control block 400 that controls the row control block 200 and the column control block 300 according to a bank selection command. The row control block 200, the column control block 300, and the bank internal control block 400 are connected in common to the switch SW-4. The switch SW-4 may be composed of an NMOS transistor. The switch SW-4 is connected to a first core ground line VSSA that connects the switch SW-4 and the core block 100, and a second core ground line VSSW that connects the switch SW-4 and the core block 100. The core block 100 may have the same structure as that of FIG. 4. The switch SW-4 may be disposed outside the bank BANK. Further, the ground power supply pad 10 and/or the bank control unit 600 are disposed outside the bank BANK.

According to the structure of the fourth embodiment shown in FIG. 8, the switch SW-4 that is controlled by an output signal bnoff of the bank control unit 600, is provided between the ground power supply pad 10 and the whole bank (whole block 100 to 400), such that an amount of leak current consumed by each of the core block 100, the row control block 200, the column control block 300, and the bank internal control block 400 forming the bank BANK is reduced. Further, all of blocks in the bank are not affected by ground noise transmitted from the outside of the bank BANK.

The embodiments shown in FIGS. 3, 6, and 7 illustrate a scheme that controls blocks, and the embodiment shown in FIG. 8 illustrates a scheme that controls banks.

Figure 9:
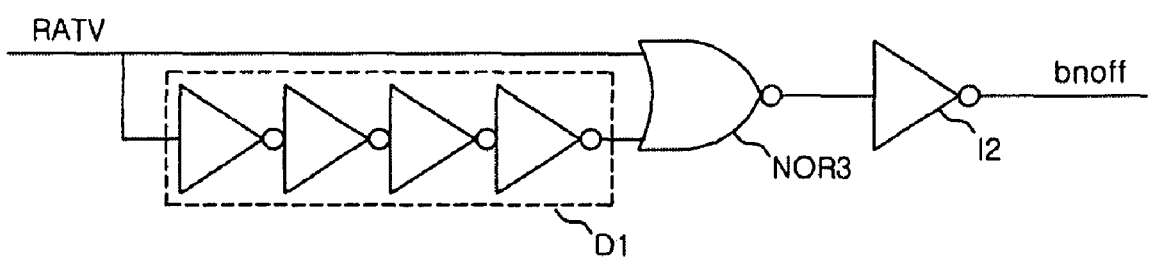
FIG. 9 is a circuit diagram illustrating a preferred embodiment of a bank control unit of FIG. 8.

FIG. 9 is a circuit diagram illustrating a preferred embodiment of the bank control unit 600. As shown in FIG. 9, the bank control unit 600 includes a delayer D1 that delays a row active signal RATV, an input unit NOR3 that receives the row active signal RATV and an output signal of the delayer D1, and a driver 12 that outputs a bank control signal controlling the switch SW-4 in response to the output signal of the input unit NOR3. The delayer D1 may be composed of an inverter chain. Further, the input unit NOR3 may be composed of a NOR gate receives as input the row active signal RATV and the output signal of the delayer. Furthermore, the driver 12 may be composed of an inverter that receives an output signal of the input unit NOR3.

Referring to FIG. 9, the bank control unit 600 uses a row active signal RATV having active information of a selected bank BANK. Accordingly, when the row active signal RATV becomes enabled at a high level, the bank control signal bnoff becomes a high level to turn on the switch SW-4. When the row active signal RATV becomes disabled at a low level, the bank control signal bnoff becomes a low level to turn off the switch SW-4, after being delayed for a predetermined time by the delayer D1. The reason why the bank control signal is delayed for a predetermined time is due to an amount of time is necessary for lowering a ground power supply level elevated by an active operation to an original ground power supply level. The delayed time may be appropriately set while considering characteristics of the semiconductor memory apparatus, which is easily implemented by adjusting the number of inverters that form the delayer D1.

Meanwhile, it should be noted that the structure of the block control unit 500 shown in FIGS. 5A and 5B is different from that of the bank control unit 600 shown in FIG. 9, but they may have the same structure. That is, it should be noted that the structure of the block control unit 500 is implemented by the circuit shown in FIG. 9, and the structure of the bank control unit 600 is implemented by the circuit shown in FIG. 5A or 5B.

Figure 10:
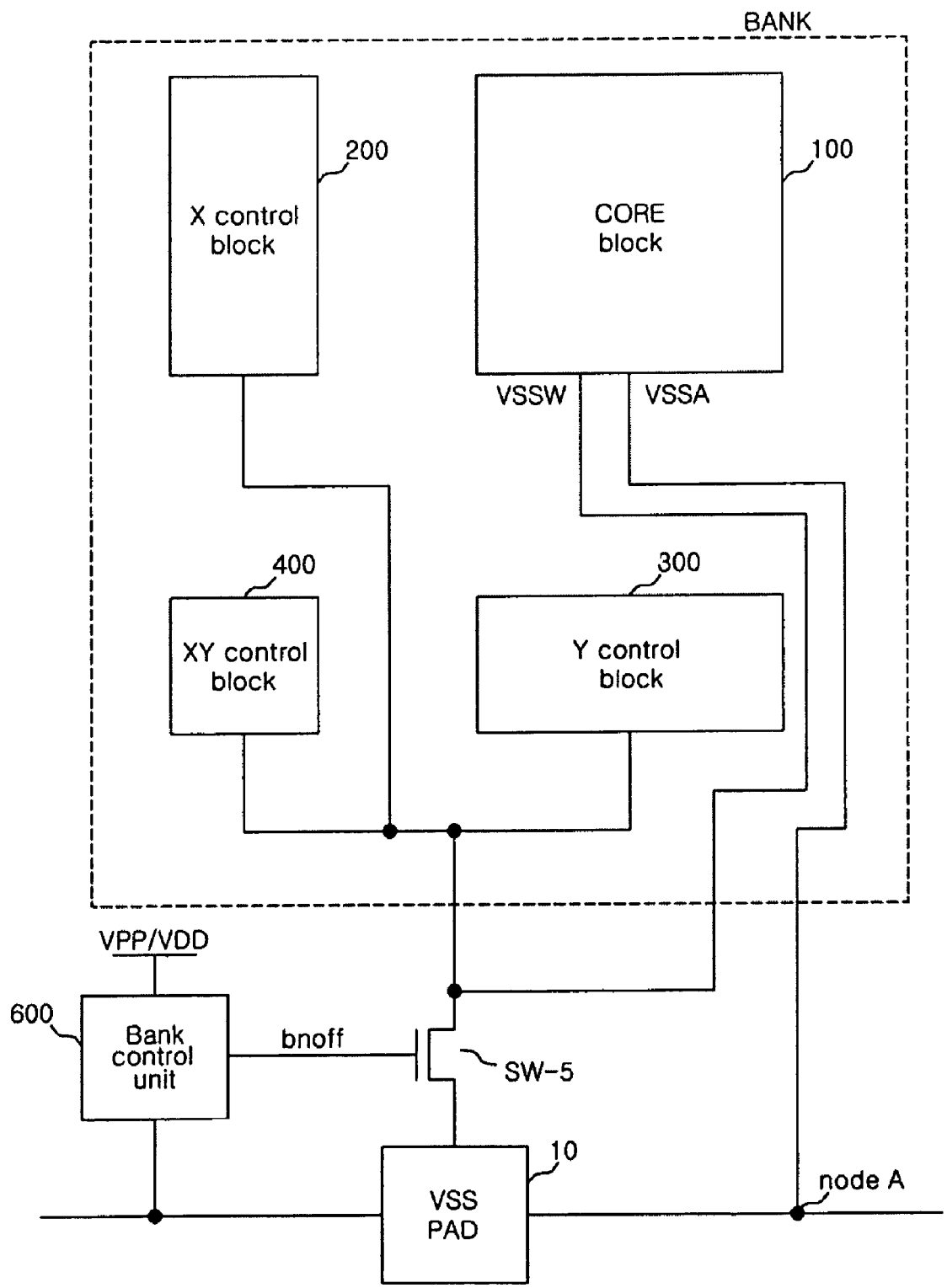
FIG. 10 is a block diagram illustrating a fifth embodiment of the invention.

FIG. 10 is a block diagram illustrating a fifth embodiment of the present invention.

A semiconductor memory apparatus according to the fifth embodiment of the present invention shown in FIG. 10 includes a bank BANK that has a core block where a memory cell array is disposed and a control block to drive the memory cell array; a ground power supply pad 10 that is supplied with a ground power supply VSS through a ground line; a switch SW-5 that connects the ground power supply pad 10 and the bank BANK; a bank control unit 600 that controls an on/off operation of the switch SW-5; a first core ground line VSSA that connects the switch SW-5 and the core block, and a second core ground line VSSW that connects the ground line (that is, node A) and the core block.

The bank BANK includes the core block 100 that has the memory cell array and a bit line sense amplifier array, a row control block 200 that drives a row address path of the core block 100, a column control block 300 that drives a column address path of the core block 100, and a bank internal control block 400 that controls the row control block 200 and the column control block 300 according to a bank selection command. The row control block 200, the column control block 300, and the bank internal control block 400 are connected in common to the switch SW-5. The bank control unit has the same structure as that of FIG. 9. The switch SW-5 may be composed of an NMOS transistor. The core block may have the same structure as that of FIG. 4. The switch SW-5, the ground power supply pad 10 and/or the bank control unit 600 may be disposed outside the bank BANK.

According to the embodiment shown in FIG. 10, the ground line VSSW connected to the sub word line driver array in the core block 100 can be directly connected to the ground line VSS (that is, node A) at the outside of the bank BANK. The other blocks in the bank BANK can be connected to the ground power supply pad 10 through the switch SW-5. A leak current that is consumed in the ground line VSSW of the core block 100 and a leak current that is consumed in the row control block 200, the column control block 300, and the bank internal control block 400, can be interrupted according to a logical level of the output signal bnoff of the bank control unit 600. In addition, it is possible to minimize an influence due to a ground power supply noise that occurs by selection of a peripheral circuit or a peripheral bank.

Figure 11:
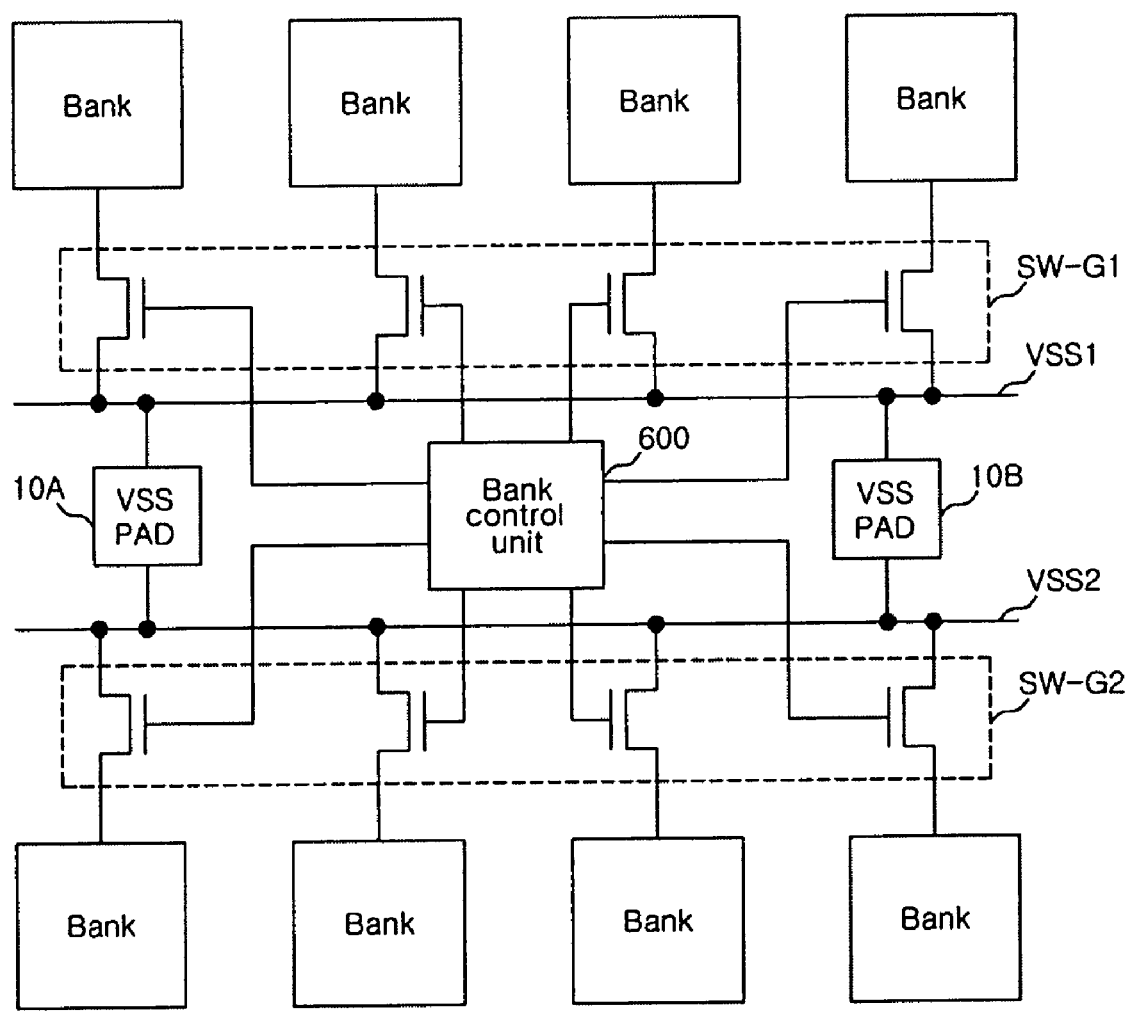
FIG. 11 is a block diagram illustrating a sixth embodiment of the invention.

FIG. 11 is a block diagram illustrating a sixth embodiment of the present invention which shows an embodiment that is effectively implemented when the above-described embodiment shown in FIG. 8 is applied to all of the banks inside a chip. A semiconductor memory apparatus according to the sixth embodiment of the present invention shown in FIG. 11 includes a first bank group (including four upper banks in FIG. 11) in which a plurality of banks BANK are disposed in an upper column (this means that they longitudinally extend in one direction of the chips, and may be embodied in an upper layer of a multi-chip package (MCP)); a second bank group (including four lower banks in FIG. 11) in which a plurality of banks are disposed in a lower column (this means that they longitudinally extend in the other direction of the chip, and may be embodied in a lower layer of the multi-chip package (MCP)); a first ground line VSS1 for the first bank group; a second ground line VSS2 for the second bank group; a first switch group SW-G1 including a plurality of switches that connect the respective banks of the first bank group to the first ground line VSS1; a second switch group SW-G2 including a plurality of switches that connect the respective banks of the second bank group to the second ground line VSS2; a bank control unit 600 that is disposed between the first bank group and a second bank group and controls an on/off operation of each of the first switch group SW-G1 and the second switch group SW-G2; and ground power supply pads 10A and 10B that are respectively connected to the first power line VSS1 and the second power line VSS2. Each of the banks that form the first and second banks has the same structure as that of FIG. 8. The bank control unit 600 may have the same structure as that of FIG. 9. The first switch group SW-G1 and the second switch group SW-G2 may be composed of NMOS transistors. The first switch group SW-G1 and the second switch SW-G2 may be disposed outside the first and second bank groups, specifically, between the first and second bank groups, as shown in FIG. 11. Further, the ground power supply pads 10A and 10B may be disposed outside the first and second bank groups, specifically, between the first and second bank groups, as shown in FIG. 11. In FIG. 11, two ground power supply pads 10A and 10B shown, but the number of the ground power supply pads can be adjusted. Furthermore, the bank control unit 600 may also be disposed outside the first bank group and the second bank group, specifically, at the center between the first and second bank groups in consideration of a signal transmission, as shown in FIG. 11. As described above, the bank control unit 600 can be implemented using selection of a unit bank and a signal having activated information, and the structure of the embodiment may be changed.

According to the structure of the sixth embodiment shown FIG. 11, ground noise occurring when a peripheral bank operates can be easily blocked, and ground noise occurring at the time of a bank interleave operation in which a plurality of banks are continuously selected and operated can be minimized.

Figure 12:
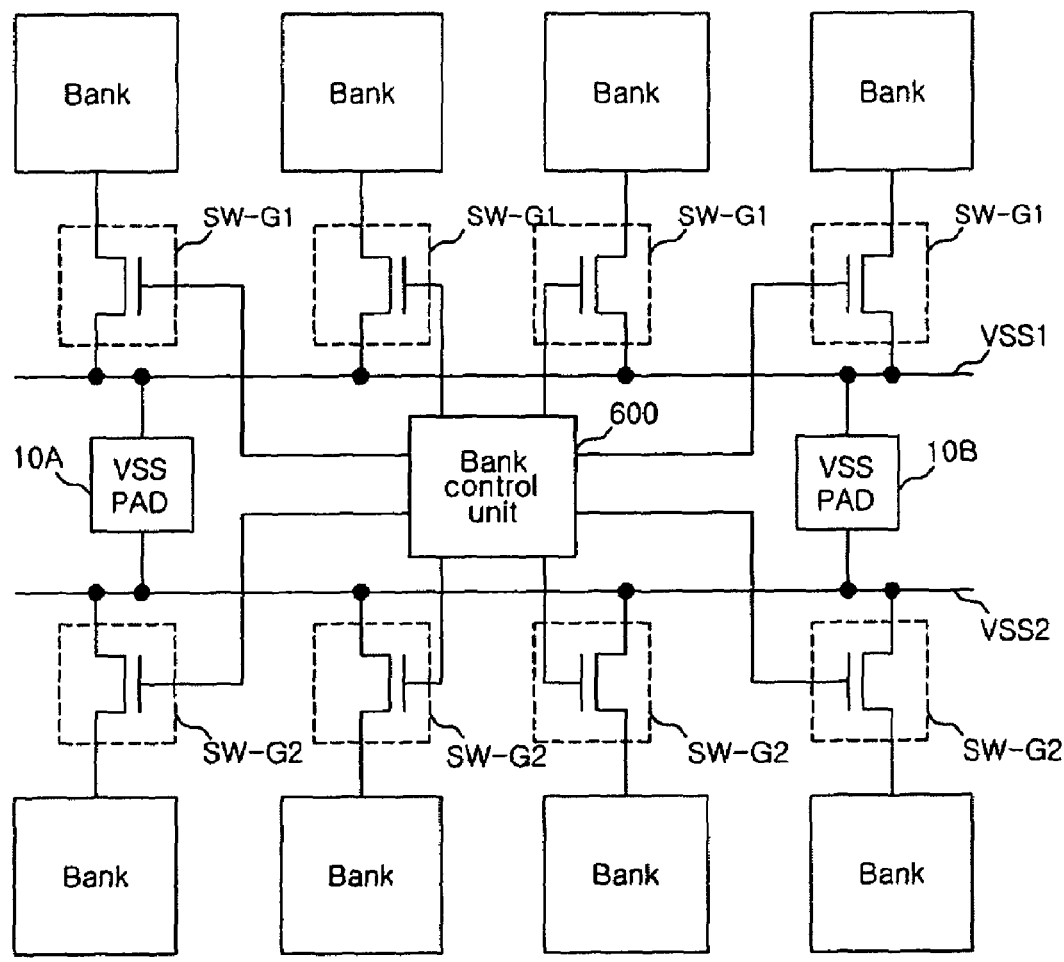
FIG. 12 is a block diagram illustrating a seventh embodiment of the invention.

FIG. 12 is a block diagram illustrating a seventh embodiment of the present invention, which shows an embodiment that is effectively implemented when the above-described embodiment shown in FIG. 10 is applied to all of the banks inside a chip. A semiconductor memory apparatus according to the seventh embodiment of the present invention shown in FIG. 12 includes a first bank group (including four upper banks in FIG. 12) in which a plurality of banks BANK are disposed in an upper column (this means that they longitudinally extend long in one direction of the chip, and may be embodied in an upper layer of a multi-chip package (MCP), a second bank group (including four lower banks in FIG. 12) in which a plurality of banks are disposed in a lower column (this means that they longitudinally extend in the other direction of the chip, and may be embodied in a lower layer of the multi-chip package (MCP), a first ground line VSS1 for the first bank group, a second ground line VSS2 for the second bank group, a first switch group SW-G1 including a plurality of switches that connect the respective banks of the first bank group to the first ground line VSS1, a second switch group SW-G2 including a plurality of switches SW-G2 that connect the respective banks of the second bank group to the second ground line VSS2, a bank control unit 600 that is disposed between the first bank group and a second bank group and controls an on/off operation of each of the first switch group SW-G1 and the second switch group SW-G2, ground power supply pads 10A and 10B that are respectively connected to the first power line VSS1 and the second power line VSS2, and a plurality of core ground lines VSSW that directly connect the banks of the first bank group and the banks of the second bank group to the first ground line or the second ground line.

Each of the banks that form the first and second banks has the same structure as that of FIG. 10. The bank control unit 600 may have the same structure as that of FIG. 9. It is preferable that each switch of the first switch group SW-G1 and the second switch group SW-G2 may be composed of an NMOS transistor. The first switch group SW-G1 and the second switch SW-G2 may be disposed outside the first and second bank groups, specifically, between the first and second bank groups, as shown in FIG. 12. Further, the ground power supply pads 10A and 10B may be disposed outside the first and second bank groups, specifically, between the first and second bank groups, as shown in FIG. 12. In FIG. 12, two ground power supply pads 10A and 10B are shown, but the number of the ground power supply pads can be adjusted. Furthermore, the bank control unit 600 also be disposed outside the first bank group and the second bank group, specifically, at the center between the first and second bank groups in consideration of a signal transmission, as shown in FIG. 12. As described above, the bank control unit 600 can be implemented using selection of a unit bank and a signal having activated information, and the structure of the embodiment may be changed.

According to the structure of the seventh embodiment shown in FIG. 12, ground noise occurring when a peripheral bank operates can be easily blocked, and ground noise occurring at the time of a bank interleave operation in which a plurality of banks are continuously selected and operated can be minimized.

As described above, since the semiconductor memory apparatus according to the embodiments of the present invention can control ground power supply connection inside or outside the bank by a control unit, it can interrupt a leak current and minimize a ground noise.

It will be apparent to those skilled in the art that various modifications and changes may be made without departing from the scope and spirit of the invention. Therefore, it should be understood that the above embodiments are not limiting, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

According to the embodiments of the invention, the core block and the control block, and the ground power supply connection of the bank can be controlled by means of the switches controlled by the block control unit 500 or the bank control unit 600, such that the influence due to the ground noise can be minimized, and a stable operation can be ensured. Further, since the ground noise outside the bank can be interrupted, the influence due to the leak current can be minimized, and an amount of current consumed can be reduced.

What is claimed is:

1. A semiconductor memory apparatus comprising:
   a bank that includes a core block where a memory cell array is disposed and a control block configured to drive the memory cell array;
   a ground power supply pad configured to receive a ground power through a ground line;
   a first and a second core ground line configured to be electrically coupled the core block with the ground line;
   a switch configured to be electrically coupled between the bank and the ground power supply pad; and
   a block control unit configured to control an on/off operation of the switch.

2. The semiconductor memory apparatus of claim 1, wherein the block control unit includes:
   an input unit configured to receive a clock enable signal and a self refresh signal and produce an output signal based thereon; and
   a driver configured to output a block control signal controlling the switch in response to the output signal of the input unit.

3. The semiconductor memory apparatus of claim 1, wherein the core block includes:
   the memory cell array where a plurality of memory cells are disposed;
   a bit line sense amplifier array where a plurality of sense amplifiers, each sensing data of each of the memory cells, are disposed;
   a sub word line driver array configured to drive word lines of the memory cells; and
   a sub hole where a relay is disposed to relay a bit line dividing signal and a bit line equalizing signal.

4. The semiconductor memory apparatus of claim 1, wherein the switch is configured to be coupled between at least one of the first and second core ground lines and the ground power supply pad.

5. The semiconductor memory apparatus of claim 1, wherein the switch is configured to be coupled between at least one of the first and second ground core lines and the ground line.

6. The semiconductor memory apparatus of claim 1, wherein the block control unit is disposed outside the bank.

7. The semiconductor memory apparatus of claim 1, wherein the bank further includes:
a row control block configured to drive a row address path of the core block;
a column control block configured to drive a column address path of the core block; and
a bank control block configured to control the row control block and the column control block according to a bank selection command.

8. The semiconductor memory apparatus of claim 7, wherein the row control block, the column control block, and the bank control block are connected in common to the ground power supply pad.

9. The semiconductor memory apparatus of claim 8, wherein the bank control unit includes:
a delay configured to delay a row active signal to produce an output signal;
an input unit configured to receive the row active signal and the output signal of the delay and to produce an output based thereon; and
a driver configured to output a bank control signal controlling the switch in response to the output signal of the input unit.

10. The semiconductor memory apparatus of claim 1, wherein the switch is a NMOS transistor receiving an output signal of the block control unit as a gate signal.

* * * * *